(12) United States Patent
Tsaur et al.

(10) Patent No.: US 8,456,222 B2
(45) Date of Patent: Jun. 4, 2013

(54) ELECTRONIC DEVICES AND METHODS

(75) Inventors: Tay-Her Tsaur, Tainan (TW); Chih-Fu Tsai, Kaohsiung County (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/188,823

(22) Filed: Jul. 22, 2011

(65) Prior Publication Data

US 2012/0019311 A1    Jan. 26, 2012

(30) Foreign Application Priority Data

Jul. 23, 2010   (TW) ................................ 99124322 A

(51) Int. Cl.
     *G11C 5/14*      (2006.01)

(52) U.S. Cl.
     USPC ........................................ 327/530; 327/536

(58) Field of Classification Search
     None
     See application file for complete search history.

(56) References Cited

U.S. PATENT DOCUMENTS

| | | | |
|---|---|---|---|
| 5,113,088 A * | 5/1992 | Yamamoto et al. | 327/536 |
| 7,710,501 B1 * | 5/2010 | Adams et al. | 348/548 |
| 2009/0304401 A1 * | 12/2009 | Hata | 399/33 |

* cited by examiner

*Primary Examiner* — Crystal L Hammond
(74) *Attorney, Agent, or Firm* — McClure, Qualey & Rodack, LLP

(57) ABSTRACT

The present invention relates to an electronic device, which comprises: a first module, comprising an I/O pad for being an interface between the electronic device and an external device, and receiving a first bias source; a second module, coupled to the first module, comprising a register, and receiving a second bias source; and a signal converter, coupled between the first module and the second module. Wherein when one of the first and second bias sources is stable and the other is unstable, the signal converter outputs a first predetermined bias value to the first or second modules receiving the unstable bias source.

12 Claims, 5 Drawing Sheets

ELECTRONIC DEVICES AND METHODS

CROSS-REFERENCE TO RELATED APPLICATIONS

This non-provisional application claims priority under 35 U.S.C. §119(a) on Patent Application No. 099124322 filed in Taiwan (R.O.C.) on Jul. 23, 2010, the entire contents of which are hereby incorporated by reference.

BACKGROUND OF THE INVENTION

1. Field of the Invention

The present invention relates to an electronic device, more particularly, an electronic device for defining initial stable state.

2. Description of the Prior Arts

In the chip design, the I/O pad may help the chip to communicate with external devices. However, due to the progress in manufacture, the voltages of the chip internal circuit and the interface input/output (I/O) circuit are different. In other words, the bias voltages of internal circuit and interface I/O circuit are respectively provided from different power source, but the I/O circuit is generally controlled by the chip internal circuit. Therefore, the necessary condition for starting to operate the I/O circuit is the bias voltages used in chip internal circuit and I/O circuit are both stable so as to prevent the false action occurred.

Accordingly, in view of the above drawbacks, the present invention provides an electronic device having predetermined voltage value, more particularly, an electronic device having unstable predetermined voltage value for improving the conventional drawbacks, such as the I/O circuit must ensure the bias voltages of the chip internal circuit and the I/O circuit are both stable before starting to operation the I/O circuit.

SUMMARY OF THE INVENTION

According to one object of the present invention, the unstable portion source between different bias sources in the I/O circuit provides a predetermined voltage value to operate the circuit with stable power source, for ensuring the related circuits coupled to the stable power source may firstly perform the basic operations without waiting for unstable power source, and the overall function of digital I/O pad will be normally operated for overcoming the conventional drawbacks when all power sources are stable. Thereby, it also accelerates the boot time and restarting power time.

According to one embodiment, the present invention provides an electronic device, which comprises: a first module, comprising an I/O pad for being an interface between the electronic device and an external device, and receiving a first bias source; a second module, coupled to the first module, comprising a register, and receiving a second bias source; and a signal converter, coupled between the first module and the second module. Wherein when one of the first and second bias source is stable and the other is unstable, the signal converter outputs a first predetermined bias value to the first or second modules receiving the unstable bias source.

According to another embodiment, the present invention provides method for an electronic device comprising: providing a first bias source to a first module comprising an input/output pad for being an interface between the electronic device and an external device; and providing a second bias source to a second module, which is coupled to the first module and comprises a register; wherein when one of the first and second bias source is stable and the other is unstable, the signal converter outputs a first predetermined bias value to the first or second modules receiving the unstable bias source.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become readily understood from the detailed description given herein below and the accompanying drawings which are given by way of illustration only, and thus are not limitative of the present invention and wherein.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

Figure 1:
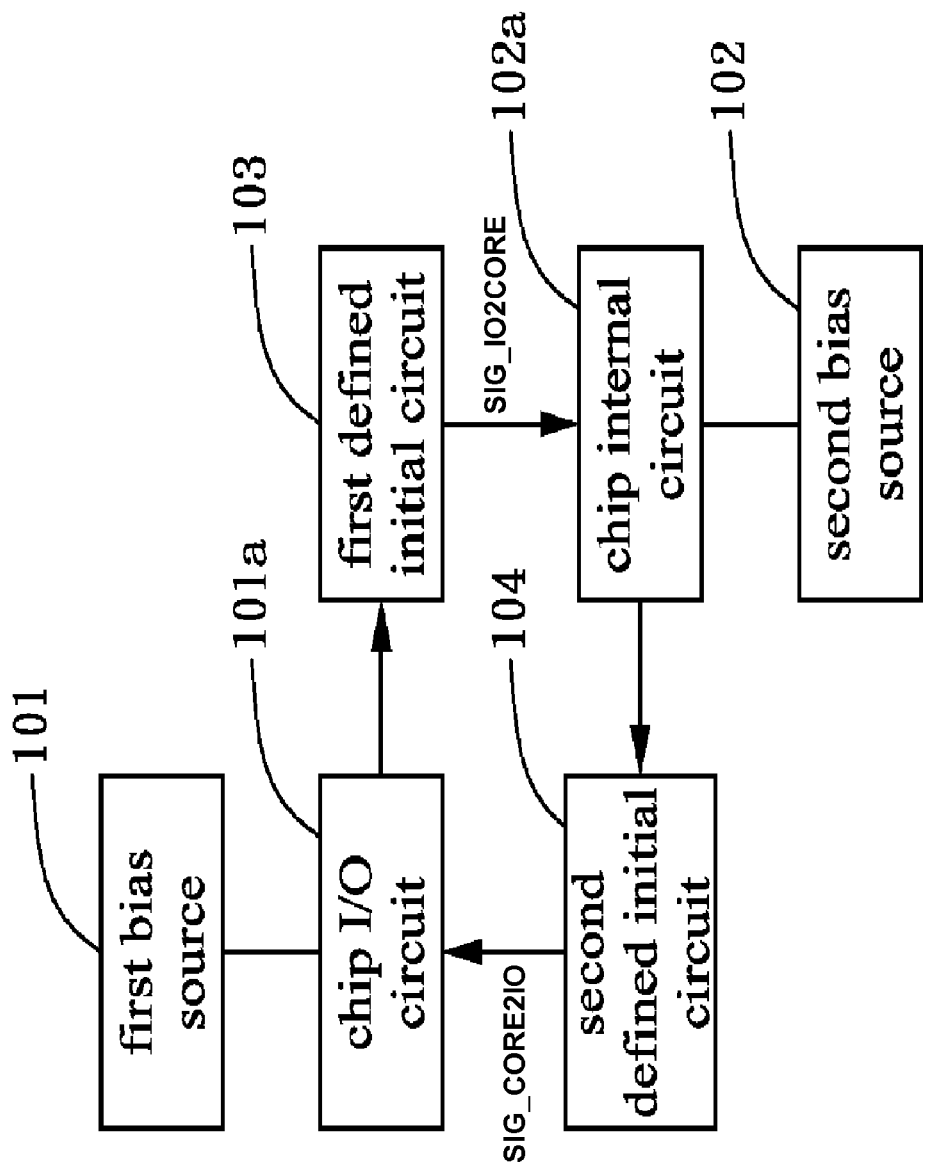
FIG. 1 illustrates a schematic diagram of an electronic device according to one embodiment of the present invention.

FIG. 1 illustrates an electronic device for defining initial stable state according to one embodiment of the present invention. The electronic device has two power sources: a first bias source (I/O power) 101 and a second bias source (Core power) 102. Wherein the first bias source 101 is used as the power source of a chip input/output (I/O) circuit 101*a*, and the second bias source 102 is used as the power source of a chip internal circuit 102*a*. The voltage level of the first bias source 101 is higher than second bias source 102. A first signal Sig_IO2CORE represents a signal is provided to the chip internal circuit 102*a* from the chip I/O circuit 101*a*, and a second signal Sig_CORE2IO represents a signal is provided to the chip I/O circuit 101*a* from the chip internal circuit 102*a*. Wherein the chip internal circuit 102*a* may be a circuit of any type in the chip, such as a processor, an adder, a memory, a register, a buffer and the like.

The first signal Sig_IO2CORE is served as the input of the chip internal circuit 102*a* after the first bias source 101 is stable state. Therefore, a first defined initial circuit 103 is used to set an initial predetermined values (for example voltage) of a first initial signal Ini_Sig_IO2CORE for providing to the chip internal circuit 102a. Thereby, the portion circuits in the chip internal circuit 102a will be operated, without waiting for the first bias source 101 stable, as long as the second bias source 102 is the stable state. Similarly, the second signal Sig_CORE2IO is not served as the input of the chip I/O circuit 101a when the first bias source 101 is in stable state and the second bias source 102 is in unstable state. Thereby, the chip I/O circuit 101a may use a second defined initial circuit 104 to set the predetermined value (for example voltage) of the second initial signal Ini_Sig_CORE2IO, and thus the chip I/O circuit 101a will be operated, without waiting for the second bias source 102 stable. The present invention uses the defined initial circuit to insulate the circuit with stable bias source (for example, the chip internal circuit 102a or the chip I/O circuit 101a) from unstable bias source for lowing the effect of the unstable bias source, and accelerating the boot time and the restarting power time. Herein, the unstable bias source indicates that the bias source is not unstable and can not maintain it upon a threshold voltage of operative high voltage.

The defined initial circuit may transfer a defined initial signal to the destination port with stable voltage to perform the circuit operation according to the spec definition when the voltage in source port is unstable. Take the second defined initial circuit for instance, the voltage in the source port is the second bias source and the voltage in the destination port is the first bias source.

Preferably, the defined initial circuit may be accomplished in the chip I/O circuit.

Similarly, if there are three or more difference voltages, in accordance with another embodiment in the present invention, each of the defined initial circuits is set between the I/O circuit with different bias sources and the internal circuit.

Figure 2:
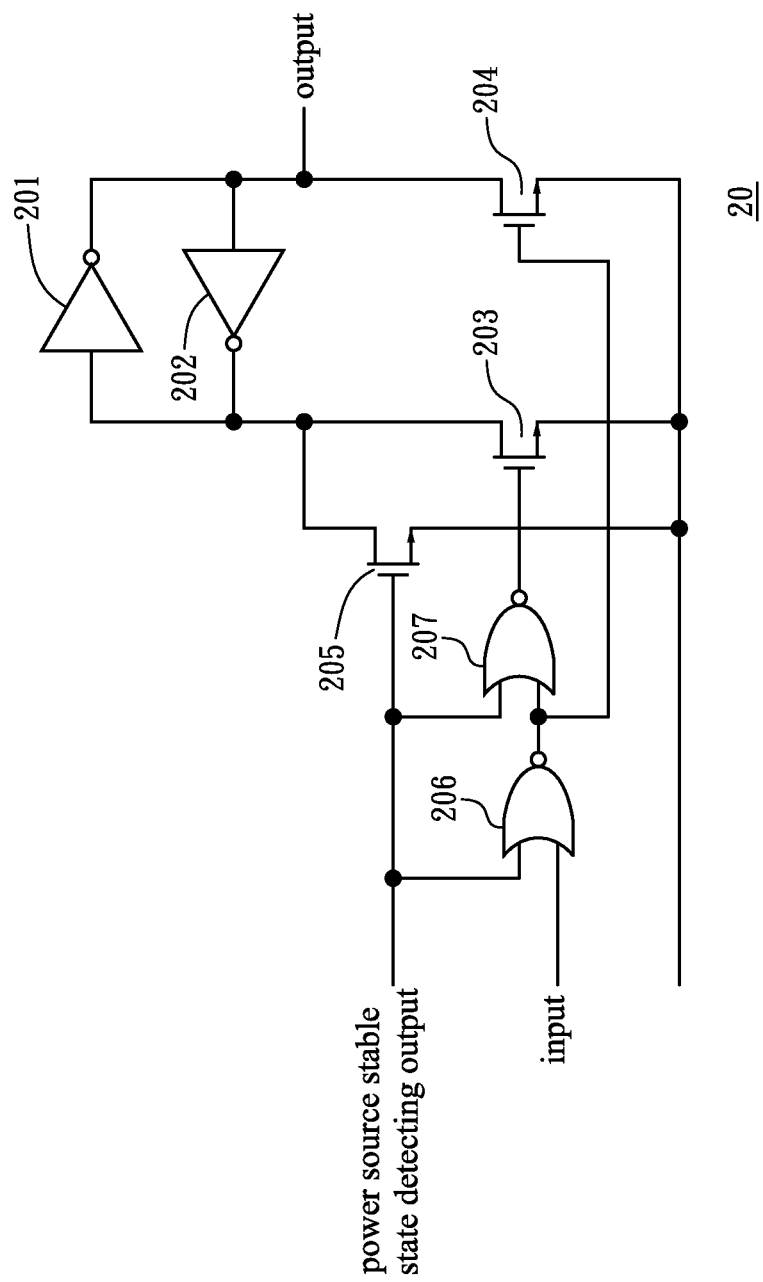
FIG. 2 illustrates a schematic diagram of a setting circuit with the predetermined value according to one embodiment of the present invention.

The defined initial circuit may include a setting circuit with predetermined values and a stable state detecting circuit. FIG. 2 illustrates a setting circuit 20 with the predetermined values according to one embodiment of the present invention. By detecting whether the bias source of the chip internal circuit 102a or chip I/O circuit 101a is stable, the setting circuit 20 with the predetermined values provides a level shift and automatically outputs an initial value when the input bias source is unstable (in the embodiment, the initial value which is 1, is a bias level of destination port).

The setting circuit 20 with the predetermined values includes: a first inverter 201; a second inverter 202, wherein the second inverter 202 is oppositely coupled to the first inverter 201; a first transistor 203, for pulling down the input voltage of the first inverter 201; a second transistor 204, for pulling down the input voltage of the second inverter 202; and a plurality of third transistors 205 and two XOR gates 206, 207, for receiving a output from a stable state detecting circuit (for example, the power source stable state detecting output is high level when the power source from the source port is unstable) and an input signal (from source port) so as to determine whether pull down the voltage of the first inverter 201 by the first transistor 203 or pulls down the voltage of the second inverter 202 by the second transistor 204. In the embodiment, when the power source stable state detecting output is high level, whatever the input value, the predetermined initial value is 1.

Figure 3A:
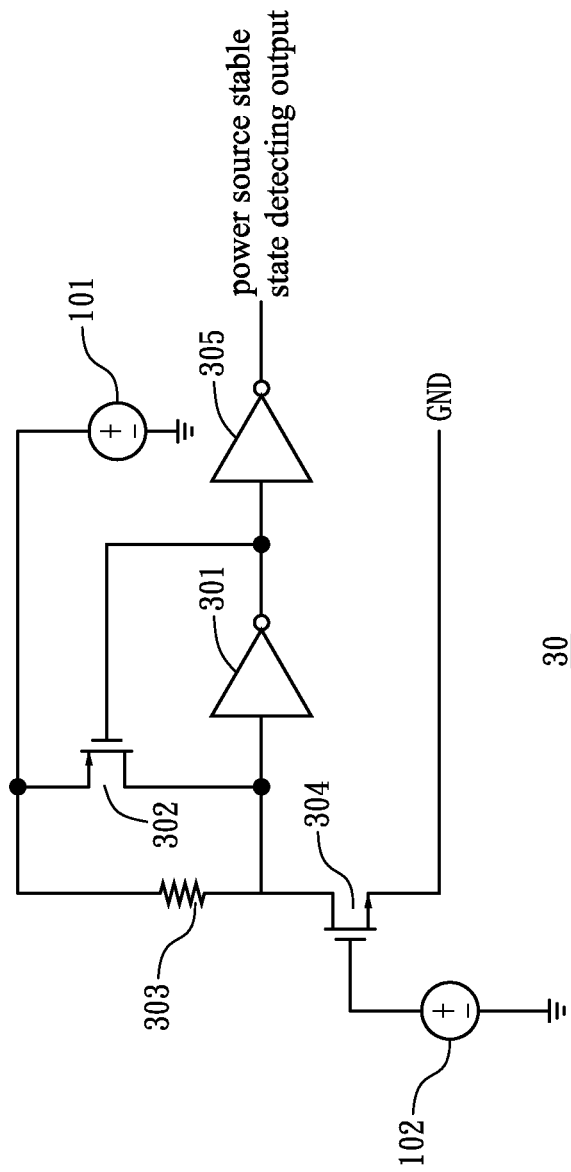
FIG. 3A/3B illustrates a schematic diagram of the stable state detecting circuit of the defined initial circuit according to one embodiment of the preset invention.

FIG. 3 illustrates a stable state detecting circuit 30 according to one embodiment of the present invention. Take the first bias source 101 and second bias source 102 for instances, they comprise: a first inverter 301, receiving the selected bias (for example the first bias source 101) of the stable state detecting circuit 30; a first transistor 302 (herein P type), wherein the gate thereof is controlled by the first inverter 301, and the drain thereof gives a signal feedback to the input end of the first inverter 301; a resistance 303, wherein one end thereof is coupled to the selected bias of the stable state detecting circuit 30 for setting the initial values of the input of the first inverter 301; and a second transistor 304 (herein N type), wherein the gate thereof is controlled by unselected bias (for example the second bias source 102) for discharging the input of the first inverter 301; an second inverter 305, coupled to the first inverter 301 and the gate of the first transistor 302. Wherein the length/width ratio of the second transistor 304 is designed and larger than the length/width ratio of the first transistor 302 for accurately knowing the stable state of the second bias source 102. In the embodiment, the power source stable state detecting output is 1 when the first bias source is 1 and the second bias source 102 is not 1.

Figure 3B:
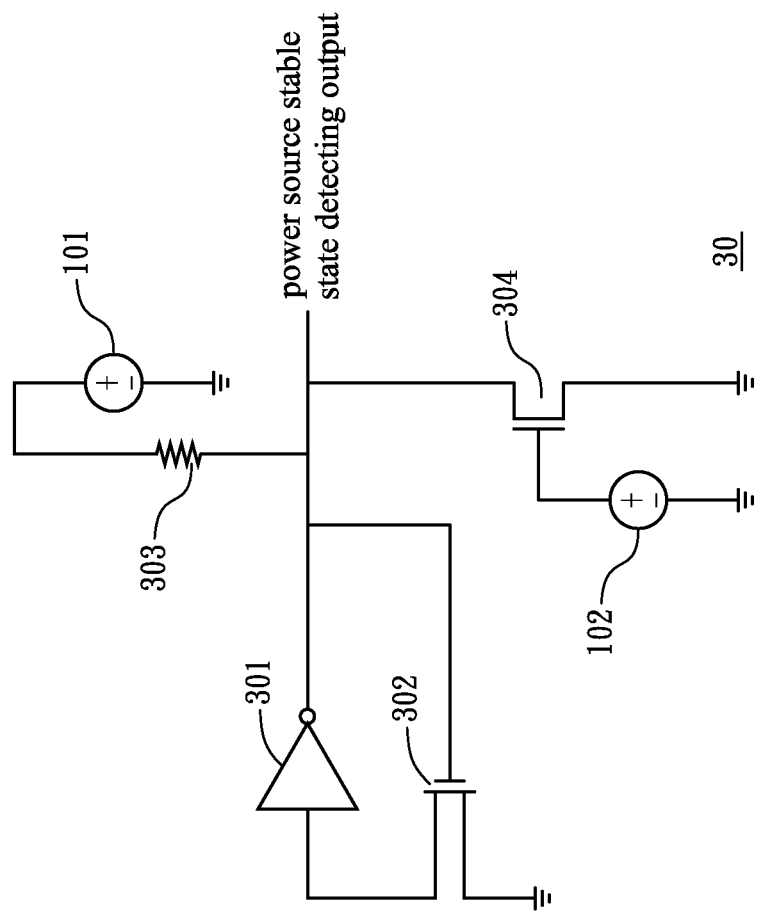

FIG. 3B illustrates the stable state detecting circuit 30 according to another embodiment of the present invention. As shown in 3B, one end of the resistance 303 is coupled to the selected bias (for example the first bias source 101) of the stable state detecting circuit 30 for setting the initial value of the input of the first inverter 301. The gate of the first transistor (herein N type) 302 is controlled by the first inverter 301 and the drain thereof gives a signal feedback to the input of the inverter 301; the gate of the second transistor 304 (herein P type) is controlled by the unselected source (for example the second bias source 102) for discharging the output of the inverter 301. In the embodiment, the power source stable state detecting output is 1 when the first bias source 101 is 1 and the second bias source 102 is not 1.

In the embodiment, the first bias source 101 and the second bias source 102 can interchanged with each other (for example, the first bias source is the unselected bias and the second bias source 102 is the selected bias). The circuit operation is similar to the description mentioned above, and thus it will not be discussed herein.

Figure 4:
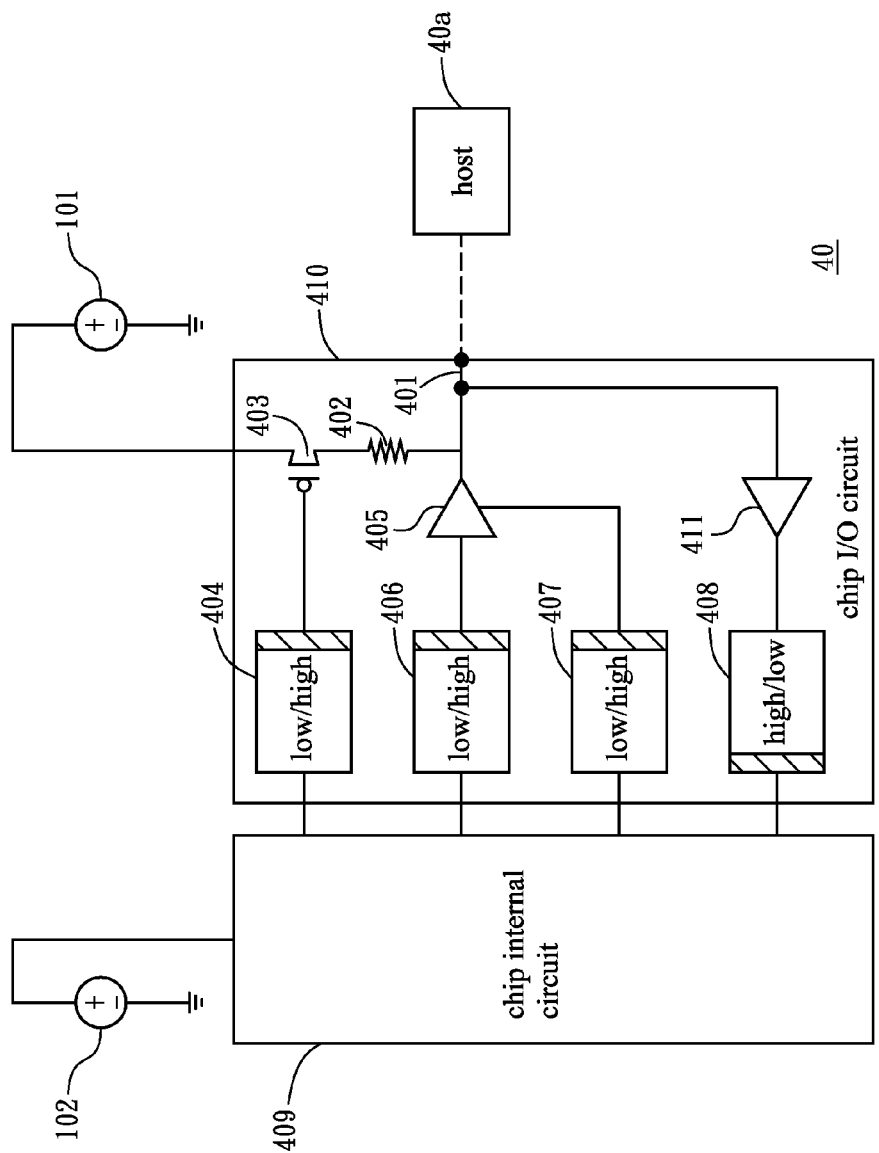
FIG. 4 illustrates a schematic diagram of a defined initial circuit in a chip according to one embodiment of the present invention.

FIG. 4 illustrates a schematic diagram showing a chip with the defined initial circuit according to one embodiment of the present invention. The chip includes: a first module (chip input/output circuit 410), including a I/O pad as an interface and receiving a power source supplied by the first bias source; a second module (chip internal circuit 409), coupled to the first module and includes a register (not shown in), for receiving a power source supplied by the second bias source and a single converter (404, 406, 407 or 408), coupled between the first module and the second module, and the signal converter outputs a first predetermined bias value to the first or second module receiving the unstable bias source when one bias source (for example, the first bias source 101 or the second bias source 102) is in stable state and the other bias (for example, the first bias source 101 or the second bias source 102) is in unstable state. Specifically, the present invention discloses a chip 40 with enabled pin 401 and the chip 40 is coupled to a host (or a external circuit) 40a. The chip 40 respectively receives the power source from the first bias source 101 and the second bias source 102.

The chip I/O circuit 410 further includes: a resistance 402 and a P type transistor 403 coupled to the first bias source 101. The gate of P type transistor 403 coupled to a first signal converter 404 is controlled by the output of the defined initial circuit in the first signal converter 404. As shown in FIG. 4, the terms of "low/high" and "high/low" in the signal converters 404, 406, 407, 408 represent level shift circuits and the signal converter is used for receiving an input signal supplied by the selected bias (for example first/second bias source), and the unselected bias (for example second/first bias source) provide power to convent the input signal.

Preferably, the chip 40 further includes a second buffer 405 for driving the enabled pin 401. The first buffer 405 receives the output from the defined initial circuit in a second signal convert 406 and receives the output from a third signal convert 407 to drive the enabled pin 401.

Preferably, the chip 40 further includes a second buffer 411. The enable pin 401 receives the signal to drive a fourth signal converter 408. The fourth signal converter 408 provides an initial predetermined value to the chip internal circuit as the enable initial setting when the second bias source is unstable.

The predetermined values of the defined initial circuits in the signal converters 404, 406, 407 and 408 are changed according to the actual enable stand of the integrated circuit (IC), and thus it won't be discussed herein.

Preferably, the setting circuit with the predetermined value in FIG. 2 and the power source stable state detecting circuit are used to instead of the function of the level shift circuit and the defined initial circuit in the signal converter.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electronic device, comprising:
   a first module, comprising an I/O pad for being an interface between the electronic device and an external device, and receiving a first bias source;
   a second module, coupled to the first module, comprising a register, and receiving a second bias source; and
   a signal converter, coupled between the first module and the second module;
   wherein when one of the first and second bias sources is stable and the other is unstable, the signal converter outputs a first predetermined bias value to the first or second modules receiving the unstable bias source.

2. The electronic device as recited in claim 1, wherein the signal converter comprises:
   a stable state detecting circuit, selecting one bias from the first and second bias sources and detecting whether the other bias unselected is stable for generating a power source stable state detecting output;
   a defined initial circuit, outputting the first predetermined bias value when the power source stable state detecting output represents unstable.

3. The electronic device as recited in claim 2, wherein the signal converter receives a second module input from the second module, and the second module input is converted to the first predetermined bias value when the power source stable state detecting output represents that the second bias is unstable.

4. The electronic device as recited in claim 2, wherein the signal converter further comprises:
   a level shift circuit, for receiving an input signal with power from one bias selected from the first and second bias sources and converting power of the input signal to the unselected bias.

5. The electronic device as recited in claim 2, wherein the stable state detecting circuit comprises:
   an first inverter, receiving the selected bias of the stable state detecting circuit;
   a first transistor, wherein a gate thereof is controlled by an output of the first inverter and a drain thereof gives a signal feedback to an input of the first inverter;
   a resistance, wherein one end thereof is coupled to the selected bias of the stable state detecting circuit for setting the initial value of the input of the first inverter;
   a second transistor, wherein a gate thereof is controlled by a unselected bias for discharging the output/input of the inverter; and
   a second inverter, coupled to the first inverter and the gate of the first transistor.

6. The electronic device as recited in claim 2, wherein the defined initial circuit comprises:
   a first inverter;
   a second inverter, oppositely coupled to the first inverter;
   a first transistor, for pulling down an input voltage of the first inverter;
   a second transistor, for pulling down an input voltage of the second inverter; and
   a plurality of third transistors, for receiving the power source stable state detecting output and an input signal.

7. The electronic device as recited in claim 1, wherein when the first bias source is stable and the second bias source is not stable, the register is set according to the first predetermined bias value.

8. The electronic device as recited in claim 1, wherein the electronic device is set in a chip.

9. A method for an electronic device, comprising:
   providing a first bias source to a first module comprising an input/output pad for being an interface between the electronic device and an I/O port of an external device; and
   providing a second bias source to a second module, which is coupled to the first module and comprises a register;
   wherein when one of the first and second bias sources is stable and the other is unstable, the signal converter outputs a first predetermined bias value to the first or second modules receiving the unstable bias source.

10. The method as recited in claim 9, further comprising:
    selecting one bias from the first bias source and the second bias source and detecting whether the other bias unselected is stable for generating a power source stable state detecting output.

11. The method as recited in claim 10, further comprising:
    receiving a second module input from the second module, and converting the second module input to the first predetermined bias value.

12. The method as recited in claim 10, further comprising:
    wherein when the first bias source is stable and the second bias source is not stable, the register is set according to the first predetermined bias value.

* * * * *